(12) United States Patent
Hsu et al.

(10) Patent No.: US 12,501,681 B2
(45) Date of Patent: Dec. 16, 2025

(54) SEMICONDUCTOR DEVICE AND METHOD FOR FABRICATING THE SAME

(71) Applicant: Marlin Semiconductor Limited, Dublin (IE)

(72) Inventors: Te-Chang Hsu, Tainan (TW); Chun-Chia Chen, Tainan (TW); Yao-Jhan Wang, Tainan (TW)

(73) Assignee: Marlin Semiconductor Limited, Dublin (IE)

( * ) Notice: Subject to any disclaimer, the term of this patent is extended or adjusted under 35 U.S.C. 154(b) by 0 days.

(21) Appl. No.: 18/414,469

(22) Filed: Jan. 17, 2024

(65) Prior Publication Data
US 2024/0154026 A1    May 9, 2024

Related U.S. Application Data

(60) Continuation of application No. 17/744,722, filed on May 15, 2022, now Pat. No. 11,901,437, which is a
(Continued)

(30) Foreign Application Priority Data

Sep. 22, 2017    (CN) .......................... 201710865297.1

(51) Int. Cl.
*H01L 29/66* (2006.01)
*H01L 21/02* (2006.01)
(Continued)

(52) U.S. Cl.
CPC ..... *H10D 64/017* (2025.01); *H01L 21/02326* (2013.01); *H01L 21/02337* (2013.01); *H01L 21/02348* (2013.01); *H01L 21/31053* (2013.01); *H01L 21/3115* (2013.01); *H01L 21/76826* (2013.01); *H01L 21/76828* (2013.01); *H01L 21/76834* (2013.01); *H10D 30/0223* (2025.01); *H10D 30/024* (2025.01); *H10D 64/021* (2025.01); *H01L 21/76825* (2013.01); *H10D 30/62* (2025.01); *H10D 30/6219* (2025.01);
(Continued)

(58) Field of Classification Search
CPC ............ H10D 64/017; H01L 21/02326; H01L 21/02337
See application file for complete search history.

(56) References Cited

U.S. PATENT DOCUMENTS

| | | |
|---|---|---|
| 6,162,737 A | 12/2000 | Weimer |
| 6,255,180 B1 | 7/2001 | Smith |

(Continued)

FOREIGN PATENT DOCUMENTS

| | | |
|---|---|---|
| CN | 101419914 A | 4/2009 |
| CN | 101661900 A | 3/2010 |

(Continued)

*Primary Examiner* — Thao P Le
(74) *Attorney, Agent, or Firm* — Winston Hsu

(57) ABSTRACT

A semiconductor device includes a gate structure on a substrate, an offset spacer adjacent to the gate structure, a main spacer around the offset spacer, a source/drain region adjacent to two sides of the main spacer, a contact etch stop layer (CESL) adjacent to the main spacer, and an interlayer dielectric (ILD) layer around the CESL. Preferably, a dielectric constant of the offset spacer is higher than a dielectric constant of the main spacer.

5 Claims, 3 Drawing Sheets

Related U.S. Application Data continuation of application No. 16/836,872, filed on Mar. 31, 2020, now Pat. No. 11,355,619, which is a continuation of application No. 16/239,470, filed on Jan. 3, 2019, now Pat. No. 10,651,290, which is a division of application No. 15/790,043, filed on Oct. 22, 2017, now Pat. No. 10,211,314.

(51) Int. Cl.
| | |
|---|---|
| *H01L 21/3105* | (2006.01) |
| *H01L 21/3115* | (2006.01) |
| *H01L 21/768* | (2006.01) |
| *H10D 30/01* | (2025.01) |
| *H10D 64/01* | (2025.01) |
| *H10D 30/62* | (2025.01) |
| *H10D 64/66* | (2025.01) |
| *H10D 64/68* | (2025.01) |

(52) U.S. Cl.
CPC ......... *H10D 64/667* (2025.01); *H10D 64/691* (2025.01)

(56) References Cited

U.S. PATENT DOCUMENTS

| | | | |
|---|---|---|---|
| 6,764,966 B1 | 7/2004 | En | |
| 7,633,125 B2 | 12/2009 | Lu et al. | |
| 7,803,722 B2 | 9/2010 | Liang | |
| 8,008,730 B2 | 8/2011 | Fukui et al. | |
| 8,716,148 B2 | 5/2014 | Ohkura et al. | |
| 9,117,904 B2 * | 8/2015 | Chou ................... | H10D 30/792 |
| 9,679,761 B2 | 6/2017 | Rhee | |
| 10,157,988 B1 | 12/2018 | You | |
| 10,158,000 B2 * | 12/2018 | Lee ................... | H01L 21/28247 |
| 10,516,030 B2 | 12/2019 | Pan | |
| 10,867,852 B2 * | 12/2020 | Yeh ................... | H01L 21/30604 |
| 11,699,702 B2 | 7/2023 | Yang | |
| 11,764,287 B2 | 9/2023 | Liaw | |
| 2004/0259343 A1 | 12/2004 | Buller | |
| 2010/0052043 A1 | 3/2010 | Lee | |
| 2010/0102363 A1 | 4/2010 | Hause | |
| 2011/0031538 A1 | 2/2011 | Hsieh | |
| 2012/0007257 A1 * | 1/2012 | Nomura ............ | H01L 21/02271 |
| | | | 257/E23.145 |
| 2012/0070948 A1 | 3/2012 | Cheng | |
| 2012/0142176 A1 * | 6/2012 | Kim ................... | H01L 21/28123 |
| | | | 438/585 |
| 2013/0032955 A1 * | 2/2013 | Liou ................. | H01L 21/02123 |
| | | | 257/E21.24 |
| 2013/0105916 A1 | 5/2013 | Chang | |
| 2013/0320414 A1 * | 12/2013 | Fan .................... | H01L 21/28247 |
| | | | 257/288 |
| 2014/0077304 A1 | 3/2014 | Huang | |
| 2014/0120668 A1 | 5/2014 | Chambers | |
| 2015/0228788 A1 | 8/2015 | Chen | |
| 2019/0058050 A1 * | 2/2019 | Hsu ...................... | H10D 64/667 |
| 2020/0135887 A1 | 4/2020 | Wu | |
| 2020/0235224 A1 | 7/2020 | Hsu | |
| 2020/0321332 A1 | 10/2020 | Zainuddin | |
| 2021/0272966 A1 | 9/2021 | Lin | |
| 2022/0336626 A1 | 10/2022 | Cheng | |
| 2023/0238449 A1 | 7/2023 | Su | |
| 2023/0261080 A1 | 8/2023 | Lin | |
| 2023/0299204 A1 | 9/2023 | Yeong | |
| 2024/0387681 A1 * | 11/2024 | Lin .................... | H10D 84/0193 |
| 2025/0159928 A1 * | 5/2025 | Yun ...................... | H10D 88/01 |

FOREIGN PATENT DOCUMENTS

| | | |
|---|---|---|
| CN | 102290351 A | 12/2011 |
| CN | 102859666 A | 1/2013 |
| CN | 104979206 A | 10/2015 |
| CN | 106684041 A | 5/2017 |

\* cited by examiner

SEMICONDUCTOR DEVICE AND METHOD FOR FABRICATING THE SAME

CROSS REFERENCE TO RELATED APPLICATIONS

This application is a continuation application of U.S. application Ser. No. 17/744,722, filed on May 15, 2022, which is a continuation application of U.S. application Ser. No. 16/836,872, filed on Mar. 31, 2020, now U.S. Pat. No. 11,355,619, issued on Jun. 7, 2022, which is a continuation application of U.S. application Ser. No. 16/239,470, filed on Jan. 3, 2019, now U.S. Pat. No. 10,651,290, issued on May 12, 2020, which is a division of U.S. application Ser. No. 15/790,043, filed on Oct. 22, 2017, now U.S. Pat. No. 10,211,314, issued on Feb. 19, 2019. The contents of these applications are incorporated herein by reference.

BACKGROUND OF THE INVENTION

1. Field of the Invention

The invention relates to a method for fabricating semiconductor device, and more particularly to a method of using curing process to lower the overlap capacitance ($C_{ov}$) after forming interlayer dielectric (ILD) layer.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal transistor, since elements such as spacer and contact etch stop layer (CESL) are typically made of material having substantially higher dielectric constant, the overlap capacitance between gate structure and source/drain region could not have been controlled under a desirable range thereby affecting the performance of the device substantially. Hence, how to resolve this issue has become an important task in this field.

SUMMARY OF THE INVENTION

According to an embodiment of the present invention, a method for fabricating semiconductor device includes the steps of first forming a gate structure on a substrate, forming a contact etch stop layer (CESL) on the gate structure, forming an interlayer dielectric (ILD) layer around the gate structure, performing a curing process so that an oxygen concentration of the CESL is different from the oxygen concentration of the ILD layer, and then performing a replacement metal gate process (RMG) process to transform the gate structure into a metal gate.

According to another aspect of the present invention, a semiconductor device includes a gate structure on a substrate, an offset spacer adjacent to the gate structure, a main spacer around the offset spacer, a source/drain region adjacent to two sides of the main spacer, a contact etch stop layer (CESL) adjacent to the main spacer, and an interlayer dielectric (ILD) layer around the CESL. Preferably, a dielectric constant of the offset spacer is higher than a dielectric constant of the main spacer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
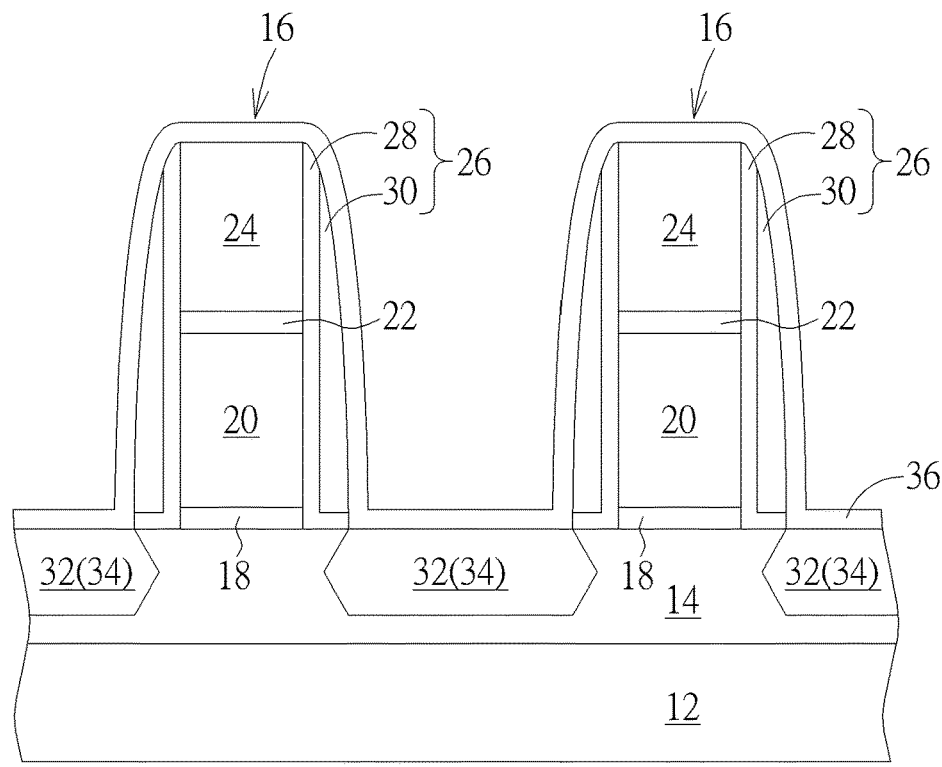
FIGS. 1-5 illustrate a method for fabricating a semiconductor device according to an embodiment of the present invention.

Referring to FIGS. 1-5, FIGS. 1-5 illustrate a method for fabricating a semiconductor device according to an embodiment of the present invention. As shown in FIG. 1, a substrate 12, such as a silicon substrate or silicon-on-insulator (SOI) substrate is first provided, and at least a transistor region such as a NMOS region or a PMOS region are defined on the substrate 12. Next, at least a fin-shaped structure 14 is formed on the substrate 12, in which the bottom of the fin-shaped structure 14 is surrounded by an insulating layer or shallow trench isolation (STI) made of material including but not limited to for example silicon oxide. It should be noted that even though this embodiment pertains to the fabrication of a non-planar FET device such as FinFET device, it would also be desirable to apply the following processes to a planar FET device, which is also within the scope of the present invention.

According to an embodiment of the present invention, the fin-shaped structure 14 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 14 could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, at least a gate structure 16 or dummy gate is formed on the substrate 12. In this embodiment, the formation of the gate structures 16 could be accomplished by a gate first process, a high-k first approach from gate last process, or a high-k last approach from gate last process. Since this embodiment pertains to a high-k last approach, a gate dielectric layer 18 or interfacial layer, a gate material layer 20 made of polysilicon, a first hard mask 22, and a second hard mask 24 could be formed sequentially on the substrate 12, and a pattern transfer process is then conducted by using a patterned resist (not shown) as mask to remove part of the second hard mask 24, part of the first hard mask 22, part of the gate material layer 20 and part of the gate dielectric layer 18 through single or multiple etching processes. After stripping the patterned resist, gate structures 16 each composed of a patterned gate dielectric layer 18, a patterned gate material layer 20, a patterned first hard mask 22, and a patterned second hard mask 24 are formed on the substrate 12.

Next, at least a spacer 26 is formed on the sidewalls of the each of the gate structures 16, a source/drain region 32 and/or epitaxial layer 34 is formed in the fin-shaped structure 14 adjacent to two sides of the spacer 26, selective silicide layers (not shown) could be formed on the surface of the source/drain regions 32, and a contact etch stop layer (CESL) 36 is formed on the surface of the fin-shaped structure 14 and the gate structures 16. In this embodiment, the spacer 26 could be a single spacer or a composite spacer, such as a spacer including but not limited to for example an offset spacer 28 and a main spacer 30. Preferably, the offset spacer 28 and the main spacer 30 could include same material or different material while both the offset spacer 28 and the main spacer 30 could be made of material including but not limited to for example $SiO_2$, SiN, SiON, SiCN, or combination thereof. The source/drain regions 32 could include n-type dopants or p-type dopants depending on the type of device being fabricated. The CESL 36 is preferably made of SiN or SiCN, but not limited thereto.

Figure 2:
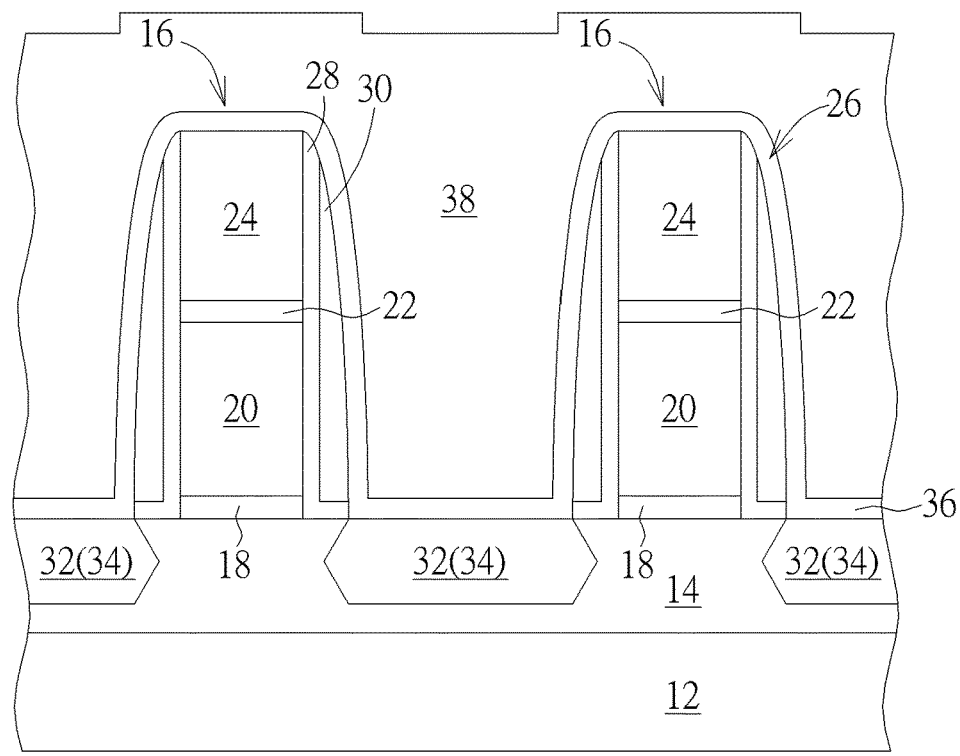

Next, as shown in FIG. 2, an interlayer dielectric (ILD) layer 38 made of silicon dioxide or silicon oxycarbide (SiOC) is formed on the CESL 36, and a curing process is conducted to increase the strength of the main spacer 30. Specifically, the curing process preferably includes an extreme ultraviolet (EUV) curing process, in which the curing process is accomplished by injecting ozone ($O_3$) along with a thermal treatment process during ultraviolet light irradiation. This alters the dielectric constant of the spacer 26 and the CESL 36 and at the same time lowers the overlap capacitance ($C_{ov}$) between the gate structure 16 and the source/drain region 32.

It should be noted that the main spacer 30 and the CESL 36 of this embodiment are preferably made of dielectric material having slightly higher dielectric constant before the curing process. For instance, both the main spacer 30 and the CESL 36 are preferably made of SiCN. By using the aforementioned thermal treatment process to drive oxygen atom from ozone into the main spacer 30, the CESL 36, and the ILD layer 38 during the curing process, it would be desirable to transform the material of the main spacer 30, CESL 36, and ILD layer 38 into a material having substantially lower dielectric constant after the curing process. Specifically, the main spacer 30 and CESL 36 both originally made of SiCN are preferably transformed into material having lower dielectric constant such as SiOCN after drive-in of oxygen while the material of the ILD layer 38 originally made of SiOC remains unchanged.

Moreover, the dielectric constant of the main spacer 30, CESL 36, and ILD layer 38 are also slightly adjusted after the curing process is conducted. For instance, the main spacer 30 originally made of SiCN having a dielectric constant of about 5.0 is preferably transformed into SiOCN having a dielectric constant of about 4.6, the CESL 36 originally made of SiCN having a dielectric constant of about 5.0 or slightly higher than 5.0 is also transformed into SiOCN having a dielectric constant of about 4.6, and the ILD layer 38 originally made of SiOC having a dielectric constant of about 4.6 remains same material and dielectric constant. In other words, the main spacer 30, CESL 36, and ILD layer 38 originally having different dielectric constants are preferably transformed into either same material or different material all sharing same dielectric constant after the curing process. It is to be noted that since the offset spacer 28 made of SiCN is disposed close to the gate structure 16 and virtually no oxygen atoms were driven into the offset spacer 28 during the curing process, the dielectric constant of the offset spacer 28 (preferably around 5.0) remains relatively constant before and after the curing process and is also slightly higher than the dielectric constant of the main spacer 30 after the curing process.

It should further be noted that even though the main spacer 30 and the CESL 36 are both composed of SiCN in the aforementioned embodiment, according to an embodiment of the present invention, either one of the main spacer 30 or the CESL 36 or both the main spacer 30 and the CESL could be made of SiN having dielectric constant of approximately 6.5 before the curing process. In this instance, after the curing process is conducted and oxygen atoms were driven into the main spacer 30 and the CESL 36, the material of the main spacer 30 and the CESL 36 would be transformed from SiN to silicon oxynitride (SiON) and the dielectric constant of the two elements 30 and 36 would also be lowered to be substantially equal to the dielectric constant of the ILD layer 38, which is also within the scope of the present invention.

Viewing from another perspective, since oxygen atoms were driven from the ozone into the main spacer 30, CESL 36, and ILD layer 36 by thermal treatment during the curing process, the oxygen concentration in the CESL 36 is preferably different form the oxygen concentration in the ILD layer 38 after the curing process. Preferably, the oxygen concentration in the ILD layer 38 is greater than the oxygen concentration in the CESL 36 after the curing process is conducted, or if viewed from a more detailed perspective, the oxygen concentration on a surface of the CESL 36 is also greater than the oxygen concentration within the CESL 36.

In this embodiment, the temperature of the thermal treatment in the curing process is between 500° C. to 800° C., the pressure of the curing process is between 1 Torr to 760 Torr, and the duration of the curing process is between 50 minutes to 70 minutes and most preferably at 60 minutes.

Figure 3:
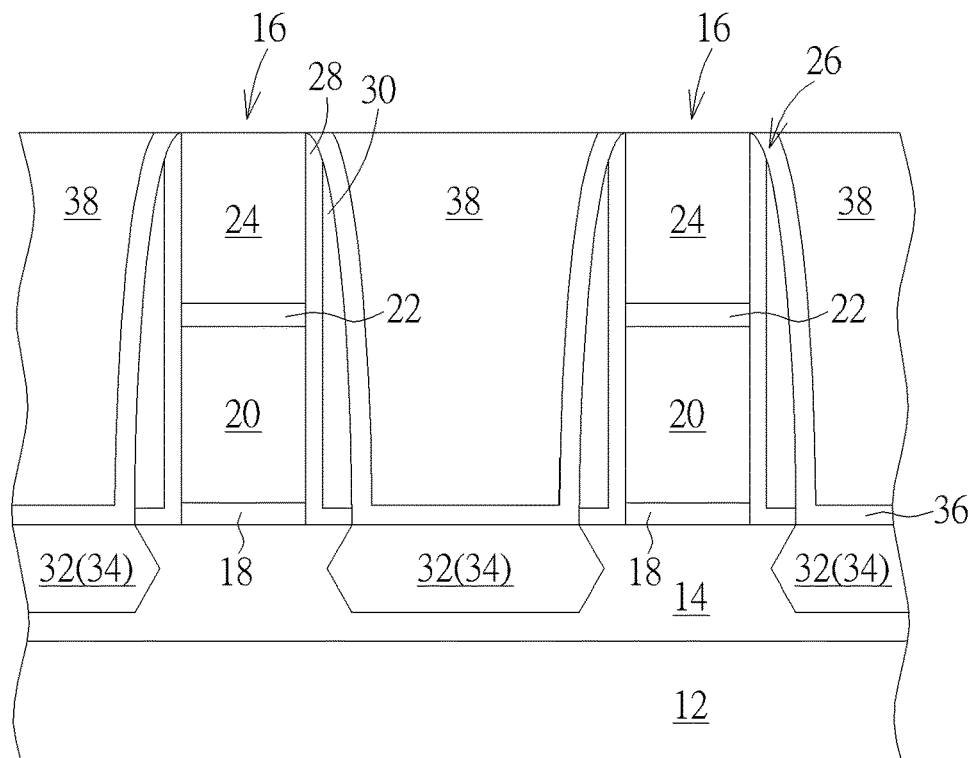

Next, as shown in FIG. 3, a planarizing process such as chemical mechanical polishing (CMP) process is conducted to remove part of the ILD layer 32 and part of the CESL 30 to expose the second hard masks 24 so that the top surfaces of the second hard masks 24 and the ILD layer 32 are coplanar. It should be noted that even though the curing process is conducted before the planarizing process in the aforementioned embodiment, according to an embodiment of the present invention, it would also be desirable to conduct the curing process after the planarizing process is completed such as by conducting the curing process after the top surface of the second hard mask 24 is even with the top surfaces of the ILD layer 38, which is also within the scope of the present invention.

Figure 4:
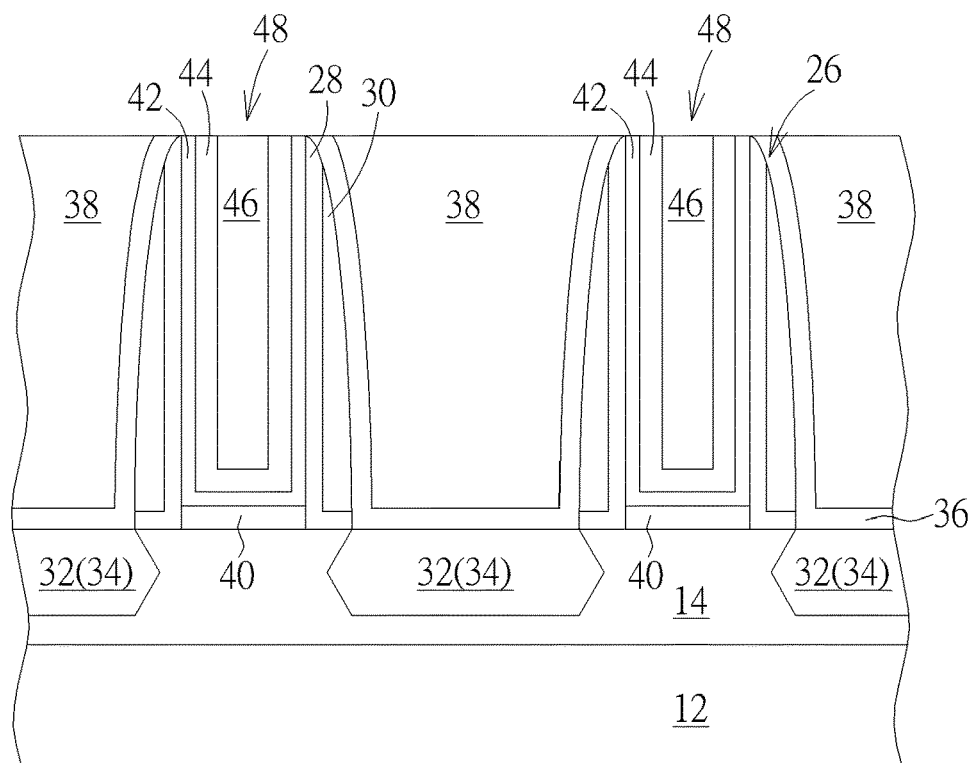

Next, as shown in FIG. 4, a replacement metal gate (RMG) process is conducted to transform each of the gate structures 16 into metal gate. For instance, the RMG process could be accomplished by first performing a selective dry etching or wet etching process using etchants including but not limited to for example ammonium hydroxide (NH$_4$OH) or tetramethylammonium hydroxide (TMAH) to remove the second hard mask 24, the first hard mask 22, the gate material layer 20, and even the gate dielectric layer 18 to form recesses (not shown) in the ILD layer 38. Next, a selective interfacial layer or gate dielectric layer 40, a high-k dielectric layer 42, a work function metal layer 44, and a low resistance metal layer 46 are formed in the recesses, and a planarizing process such as CMP is conducted to remove part of low resistance metal layer 46, part of work function metal layer 44, and part of high-k dielectric layer 42 to form gate structures made of metal gates 48. In this embodiment, the gate structure or metal gates 48 fabricated through high-k last process of a gate last process preferably includes an interfacial layer or gate dielectric layer 40, a U-shaped high-k dielectric layer 42, a U-shaped work function metal layer 44, and a low resistance metal layer 46.

In this embodiment, the high-k dielectric layer 42 is preferably selected from dielectric materials having dielectric constant (k value) larger than 4. For instance, the high-k dielectric layer 42 may be selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZr$_x$Ti$_{1-x}$O$_3$, PZT), barium strontium titanate (Ba$_x$Sr$_{1-x}$TiO$_3$, BST) or a combination thereof.

In this embodiment, the work function metal layer 44 is formed for tuning the work function of the metal gate in accordance with the conductivity of the device. For an NMOS transistor, the work function metal layer 44 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 44 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 44 and the low resistance metal layer 46, in which the material of the barrier layer may include titanium (Ti), titanium nitride (TiN), tantalum (Ta) or tantalum nitride (TaN). Furthermore, the material of the low-resistance metal layer 46 may include copper (Cu), aluminum (Al), titanium aluminum (TiAl), cobalt tungsten phosphide (CoWP) or any combination thereof.

Figure 5:
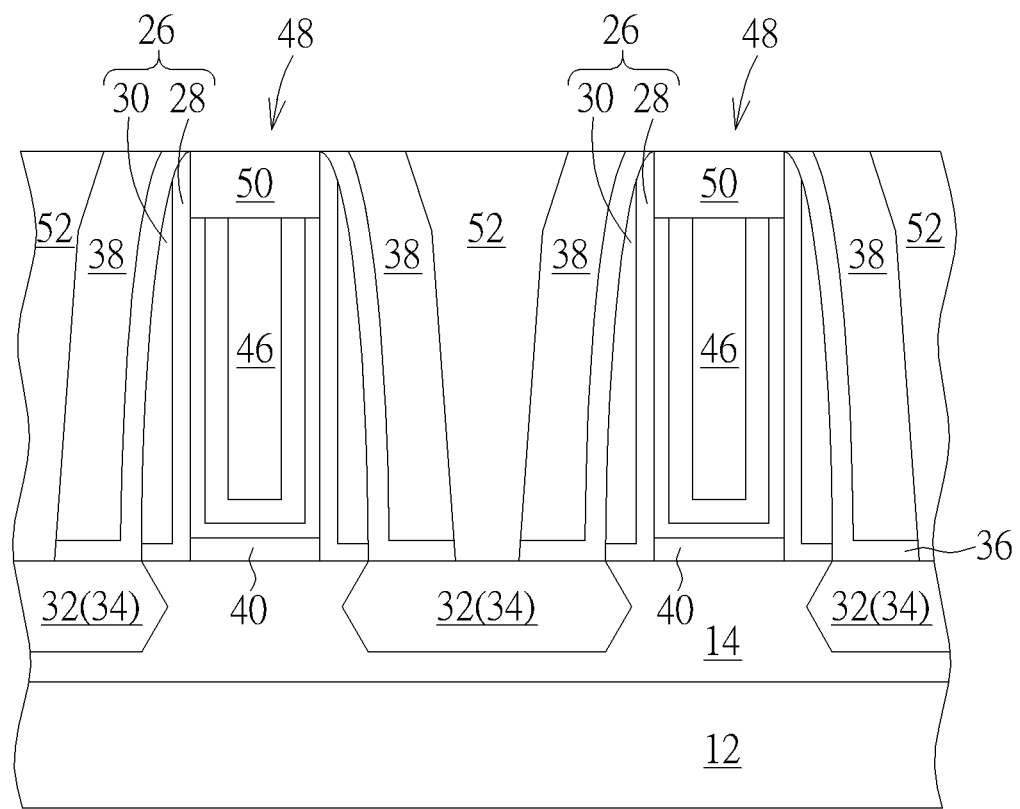

Next, as shown in FIG. 5, part of the low resistance metal layer 46, part of the work function metal layer 44, and part of the high-k dielectric layer 42 are removed to form another recess (not shown), and hard masks 50 made of dielectric material including but not limited to for example silicon nitride are deposited into the recesses so that the top surfaces of the hard masks 50 and ILD layer 38 are coplanar.

Next, a photo-etching process is conducted by using a patterned mask (not shown) as mask to remove part of the ILD layer 38 adjacent to the metal gates 48 for forming contact holes (not shown) exposing the source/drain regions 32 underneath. Next, metals including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as CMP is conducted to remove part of aforementioned barrier layer and low resistance metal layer for forming contact plugs 52 electrically connecting the source/drain region 32. This completes the fabrication of a semiconductor device according to a preferred embodiment of the present invention.

Referring again to FIG. 5, which further illustrates a structural view of a semiconductor device according to an embodiment of the present invention. As shown in FIG. 5, the semiconductor device preferably includes at least a gate structure or metal gate 48 on the substrate 12 or fin-shaped structure 14, a spacer 26 around the gate structure, a CESL 36 adjacent to the spacer 26, and an ILD layer 38 around the CESL 36, in which the spacer 26 further includes an offset spacer 28 and a main spacer 30.

In this embodiment, since oxygen atoms are driven into the main spacer 30, CESL 36, and ILD layer 38 through thermal treatment during the curing process, the oxygen concentration in the CESL 36 is preferably different from the oxygen concentration in the ILD layer 38. Specifically, the oxygen concentration in the ILD layer 38 is greater than the oxygen concentration in the CESL 36 and more specifically the oxygen concentration on a surface of the CESL 36 is further greater than the oxygen concentration inside the CESL 36.

Moreover, both the CESL 36 and the ILD layer 38 preferably share same dielectric constant after the curing process is conducted, or according to an embodiment of the present invention, the main spacer 30, CESL 36, and ILD layer 38 all share same dielectric constant after the curing process. The dielectric constant of the offset spacer 28 on the other hand is slightly greater than the dielectric constant of the main spacer 30, CESL 36, and ILD layer 38 after the curing process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a gate structure on a substrate;
   a spacer around the gate structure;
   a contact etch stop layer (CESL) adjacent to the spacer; and
   an interlayer dielectric (ILD) layer around the CESL, wherein the CESL and the ILD layer comprise different material and a same dielectric constant.

2. The semiconductor device of claim 1, wherein the oxygen concentration on a surface of the CESL is greater than the oxygen concentration in the CESL.

3. The semiconductor device of claim 1, wherein the spacer comprises an offset spacer and a main spacer.

4. The semiconductor device of claim 3, wherein the main spacer, the CESL and the ILD layer comprise a same dielectric constant.

5. The semiconductor device of claim 3, wherein the main spacer and the CESL comprise a same material.

* * * * *